US012094858B2

(12) United States Patent
Lo et al.

(10) Patent No.: US 12,094,858 B2
(45) Date of Patent: Sep. 17, 2024

(54) MICRO LIGHT EMITTING DIODE DISPLAY DEVICE

(71) Applicant: PlayNitride Display Co., Ltd., MiaoLi County (TW)

(72) Inventors: Yu-Yun Lo, MiaoLi County (TW); Bo-Wei Wu, MiaoLi County (TW); Chang-Feng Tsai, MiaoLi County (TW); Shiang-Ning Yang, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 400 days.

(21) Appl. No.: 17/551,185

(22) Filed: Dec. 15, 2021

(65) Prior Publication Data
US 2023/0128274 A1  Apr. 27, 2023

(30) Foreign Application Priority Data

Oct. 26, 2021 (TW) ................................. 110139588

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01)

(58) Field of Classification Search
None
See application file for complete search history.

(56) References Cited

U.S. PATENT DOCUMENTS

2009/0294780 A1  12/2009 Chou et al.
2017/0345801 A1*  11/2017 Lin ..................... H01L 25/075
(Continued)

FOREIGN PATENT DOCUMENTS

CN  107170773  9/2017
CN  111384227  7/2020
(Continued)

OTHER PUBLICATIONS

"Office Action of Taiwan Counterpart Application", issued on Oct. 4, 2022, p. 1-p. 10.
(Continued)

*Primary Examiner* — Jay C Chang
(74) *Attorney, Agent, or Firm* — JCIPRNET (57) ABSTRACT

A micro light emitting diode display device includes a circuit substrate, a plurality of positioning protrusions disposed on the circuit substrate, and a plurality of micro light emitting diodes. Each positioning protrusion has a positioning side surface and a bottom surface. A first angle is included between each positioning side surface and the corresponding bottom surface. The positioning protrusions form positioning spaces on the circuit substrate. The micro light emitting diodes are disposed in the separated positioning spaces and are electrically connected to the circuit substrate. Each micro light emitting diode has a light emitting surface and a side surface. Each light emitting surface is located at a side of the corresponding micro light emitting diode away from the circuit substrate. A second angle is included between each side surface and the corresponding light emitting surface and is less than 90 degrees and greater than or equal to the first angle.

15 Claims, 6 Drawing Sheets

(56) References Cited

U.S. PATENT DOCUMENTS

2018/0342492 A1* 11/2018 Lu .................. H01L 33/483
2021/0050495 A1   2/2021 Yang et al.

FOREIGN PATENT DOCUMENTS

| | | |
|---|---|---|
| CN | 111415926 | 7/2020 |
| CN | 111613632 | 9/2020 |
| CN | 112259671 | 1/2021 |
| CN | 112635449 | 4/2021 |
| CN | 113161373 | 7/2021 |
| TW | 202029309 | 8/2020 |
| TW | 202125803 | 7/2021 |

OTHER PUBLICATIONS

"Office Action of China Counterpart Application", issued on Mar. 23, 2024, p. 1-p. 9.

* cited by examiner

MICRO LIGHT EMITTING DIODE DISPLAY DEVICE

CROSS-REFERENCE TO RELATED APPLICATION

This application claims the priority benefit of Taiwan application serial no. 110139588, filed on Oct. 26, 2021. The entirety of the above-mentioned patent application is hereby incorporated by reference herein and made a part of this specification.

BACKGROUND

Technical Field

The disclosure relates to a display device, and in particular, relates to a micro light emitting diode display device.

Description of Related Art

A micro light emitting diode are thinned and miniaturized based on the structure of a light emitting diode, and the side length of the crystal grains is reduced from approximately 1 millimeter to less than 100 micrometers. Compared with the light emitting diode, the micro light emitting diode feature advantages including high pixel density, high brightness, high contrast, wide color gamut, fast response speed, high luminous efficiency, high resolution, etc., so the micro light emitting diodes have become the mainstream of a new generation of display technology.

Regarding the manufacturing process of the micro light emitting diode display device, millions of micro light emitting diodes are formed on a growth substrate first through processes such as epitaxy and isolation. Next, the micro light emitting diodes are peeled off from the growth substrate, and the micro light emitting diodes are picked up through a temporary substrate. Finally, the micro light emitting diodes are transferred from the temporary substrate onto a circuit substrate, and the micro light emitting diodes are electrically bonded to the conductive bumps on the circuit substrate. The abovementioned transfer process of the micro light emitting diodes is called mass transfer, and the positions of all micro light emitting diodes are required to be accurately controlled. Once misalignment or errors occur during the transfer process of the micro light emitting diodes, it may cause a short circuit if one electrode on each micro light emitting diode overlaps with the two conductive bumps on the circuit substrate. In another aspect, a short circuit may also occur if two electrodes on each micro light emitting diode are electrically bonded to the same conductive bump on the circuit substrate. Moreover, a deviation between the electrodes on each micro light emitting diode and the conductive bumps on the circuit substrate may lead to invalid bonding (e.g., an open circuit), and so results in poor yield and even failure of the transfer process.

SUMMARY

The disclosure provides a micro light emitting diode display device exhibiting good transfer yield and accuracy.

A micro light emitting diode display device provided by the disclosure includes a circuit substrate, a plurality of positioning protrusions, and a plurality of micro light emitting diodes. The positioning protrusions are disposed on the circuit substrate. Each of the positioning protrusions has a positioning side surface and a corresponding bottom surface. A first angle is included between each of the positioning side surfaces and the bottom surface. The positioning protrusions form a plurality of positioning spaces on the circuit substrate. The micro light emitting diodes are disposed in the separated positioning spaces and are electrically connected to the circuit substrate. Each of the micro light emitting diodes has a light emitting surface and a side surface. Each of the light emitting surfaces is located at a side of the corresponding micro light emitting diode away from the circuit substrate, and a second angle is included between each of the side surfaces and the corresponding light emitting surface. The second angle is less than 90 degrees and is greater than or equal to the first angle.

In an embodiment of the disclosure, any one of the micro light emitting diodes is located between the two positioning side surfaces of any two adjacent of the positioning protrusions, and the micro light emitting diodes has another side surface connected to the light emitting surface. The two side surfaces face the two positioning side surfaces, respectively.

In an embodiment of the disclosure, each of the micro light emitting diodes includes a first electrode and a second electrode located at a same side, and an extension line of a line connecting the first electrode and the second electrode passes through the two positioning side surfaces of the two positioning protrusions.

In an embodiment of the disclosure, the positioning side surfaces of the positioning protrusions surround any one of the positioning spaces.

In an embodiment of the disclosure, each of the positioning spaces configured with only one of the plurality of micro light emitting diode.

In an embodiment of the disclosure, the second angle is between 15 degrees and 75 degrees.

In an embodiment of the disclosure, an angle difference value between the second angle and the first angle is less than or equal to 15 degrees.

In an embodiment of the disclosure, the micro light emitting diode display device further includes a plurality of conductive bumps. Each of the positioning spaces is provided with at least one of the conductive bumps, and each of the micro light emitting diodes is bonded onto the circuit substrate through the corresponding conductive bump. Each of the positioning protrusions has a top surface, and a height of the top surface in a thickness direction of the circuit substrate is equal to the light emitting surface of each of the micro light emitting diodes.

In an embodiment of the disclosure, the micro light emitting diode display device further includes a common electrode layer. The common electrode layer covers the top surfaces of the positioning protrusions and is electrically connected to the micro light emitting diodes.

In an embodiment of the disclosure, the circuit substrate defines a display region, and the micro light emitting diodes are disposed in the display region. The micro light emitting diode display device further includes a common electrode pad disposed outside the display region, and the common electrode layer is connected to the common electrode pad.

In an embodiment of the disclosure, part of the positioning protrusions are located outside the display region, and each of the positioning protrusions has a connecting side surface opposite to the positioning side surface. The common electrode layer covers the connecting side surfaces and extends to be connected to the common electrode pad, and a third angle is included between each of the connecting side surfaces and the corresponding bottom surface. The third angle is less than the first angle.

In an embodiment of the disclosure, a cross-sectional width of each of the positioning protrusions gradually decreases from the circuit substrate to the top surface.

In an embodiment of the disclosure, a cross-sectional profile of each of the positioning protrusions is trapezoidal.

In an embodiment of the disclosure, the positioning protrusions and the micro light emitting diodes are arranged on the circuit substrate in an alternating manner.

In an embodiment of the disclosure, each of the positioning spaces is provided with two of the conductive bumps, and each of the micro light emitting diodes includes a first electrode and a second electrode located at a same side. The first electrode and the second electrode of each of the micro light emitting diodes are bonded to the two conductive bumps in the corresponding positioning space. A first distance is maintained between the first electrode and the second electrode, a second distance is maintained between the two conductive bumps, and a ratio of the second distance to the first distance is between 2 and 10.

In an embodiment of the disclosure, a gap is maintained between one of the side surfaces of the micro light emitting diode and the corresponding positioning side surface, and a width of the gap is less than or equal to 5 micrometers (μm).

To sum up, in the micro light emitting diode display device provided by the disclosure, the plurality of positioning protrusions and the plurality of conductive bumps are arranged on the circuit substrate in an alternating manner, and each of the micro light emitting diodes is disposed between any two adjacent positioning protrusions. In the process of mass transfer, the positions of the plurality of micro light emitting diodes may be accurately positioned through the plurality of positioning protrusions. In this way, each micro light emitting diode is electrically bonded to the corresponding conductive bump accurately, so generation of a short circuit or an open circuit due to positioning misalignment or errors is prevented from occurring, and the transfer yield and accuracy are further improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
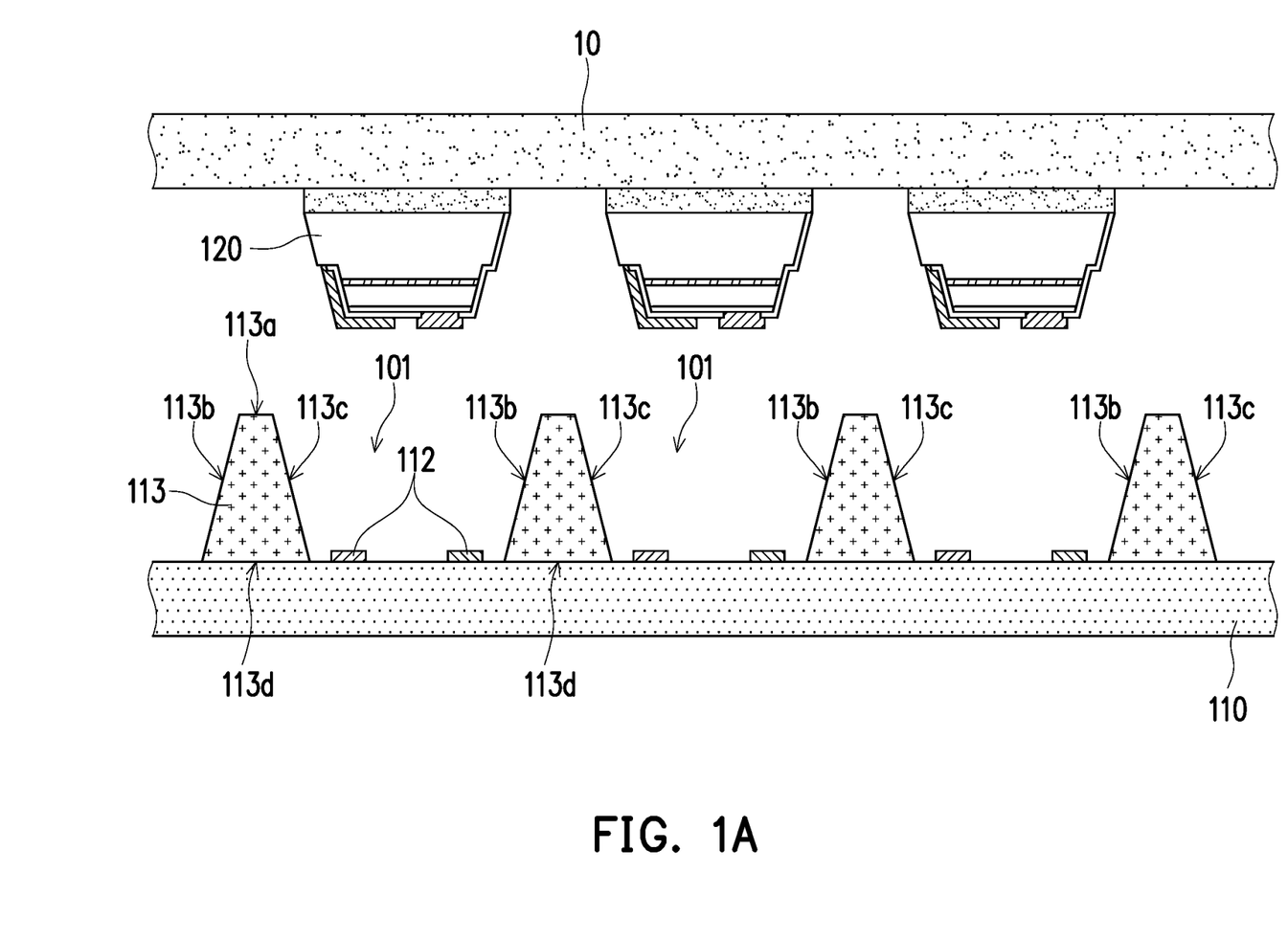
FIG. 1A and FIG. 1B are cross-sectional schematic views of a portion of a micro light emitting diode display device in a transfer process according to an embodiment of the disclosure.
Figure 1B:
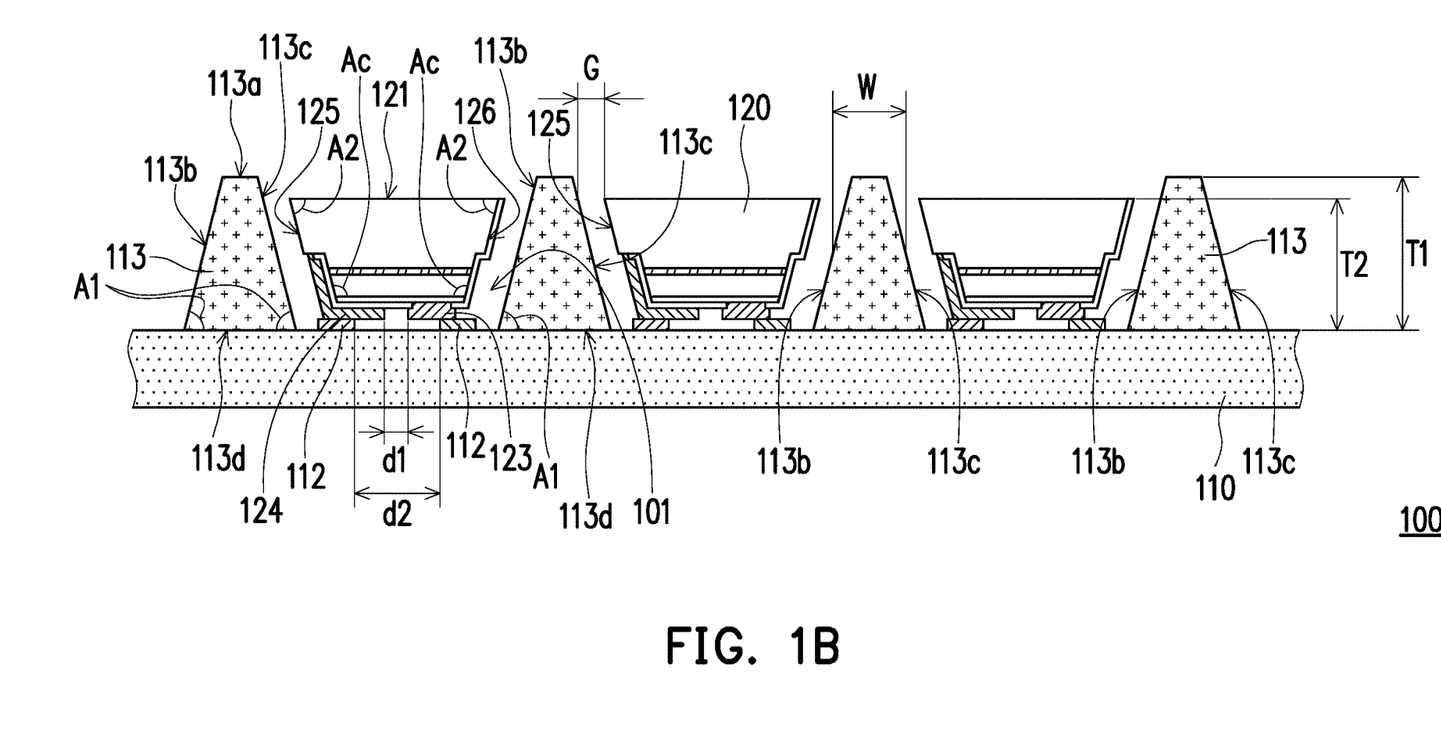

FIG. 1A and FIG. 1B are cross-sectional schematic views of a portion of a micro light emitting diode display device in a transfer process according to an embodiment of the disclosure.

Figure 2:
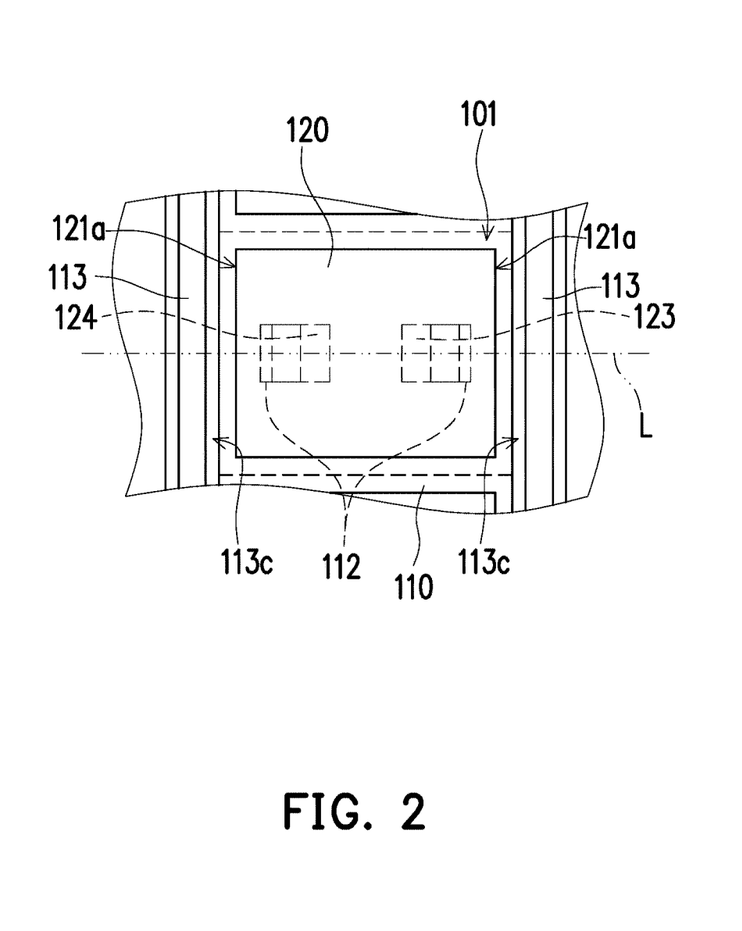
FIG. 2 is a top schematic view of a portion of the micro light emitting diode display device of FIG. 1B.

FIG. 2 is a top schematic view of a portion of the micro light emitting diode display device of FIG. 1B. With reference to FIG. 1A and FIG. 1B, a plurality of micro light emitting diodes 120 are peeled off from a growth substrate (not shown) first, and the micro light emitting diodes 120 are picked up through a temporary substrate 10. The micro light emitting diodes 120 are moved from the temporary substrate 10 onto a circuit substrate 110, the micro light emitting diodes 120 are electrically bonded to a plurality of conductive bumps 112 on the circuit substrate 110, and the transfer process of the micro light emitting diode display device 100 is finally completed.

With reference to FIG. 1A, FIG. 1B, and FIG. 2, a micro light emitting diode display device 100 includes the circuit substrate 110, a plurality of positioning protrusions 113, and a plurality of micro light emitting diodes 120. The positioning protrusions 113 are disposed on the circuit substrate 110, and each of the positioning protrusions 113 has a first positioning side surface 113b, a second positioning side surface 113c opposite to the first positioning side surface 113b, and a bottom surface 113d. The first positioning side surface 113b and the second positioning side surface 113c of each of the positioning protrusions 113 are connected to two sides of the bottom surface 113d, and the bottom surface 113d is connected to the circuit substrate 110.

As shown in FIG. 1A, the positioning protrusions 113 form a plurality of positioning spaces 101 on the circuit substrate 110. For instance, between two adjacent positioning protrusions 113, the second positioning side surface 113c of one of the positioning protrusions 113 faces the first positioning side surface 113b of the other positioning protrusion 113, and the positioning space 101 is located between the second positioning side surface 113c and the first positioning side surface 113b facing each other. Further, any two adjacent positioning spaces 101 are separated by one positioning protrusion 113.

With reference to FIG. 1B and FIG. 2, the micro light emitting diodes 120 are disposed in the separated positioning spaces 101 respectively and are electrically connected to the circuit substrate 110. To be specific, each of the positioning spaces 101 is provided with one micro light emitting diode 120, and any two adjacent micro light emitting diodes 120 are separated by one positioning protrusion 113. As shown in FIG. 2, the positioning protrusions 113 and the micro light emitting diodes 120 are arranged on the circuit substrate 110 in an alternating manner in a lateral direction. Further, each of the micro light emitting diodes 120 is located between the second positioning side surface 113c of one positioning protrusion 113 and the first positioning side surface 113b of another positioning protrusion 113.

Each of the micro light emitting diodes 120 has a light emitting surface 121, a first side surface 125, and a second side surface 126. The light emitting surface 121 is located at a side of the micro light emitting diode 120 away from the circuit substrate 110, and the first side surface 125 and the second side surface 126 are connected to two opposite sides of the light emitting surface 121. In particular, one or more positioning spaces 101 may be provided between two adjacent positioning protrusions 113. In the case that multiple positioning spaces 101 are provided between two adjacent positioning protrusions 113, an arrangement direction of the positioning spaces 101 is perpendicular to an arrangement direction of the two adjacent positioning protrusions 113. That is, in FIG. 2, in a horizontal direction, multiple micro light emitting diodes 120 may be provided between any two adjacent positioning protrusions 113. However, these micro light emitting diodes 120 are arranged in a vertical direction. Moreover, in each micro light emitting diode 120, the first side surface 125 faces the second positioning side surface 113c of one positioning protrusion 113, and the second side surface 126 faces the first positioning side surface 113b of another positioning protrusion 113.

Further, each of the micro light emitting diodes 120 has a bottom surface facing the circuit substrate 110. The light emitting surface 121 and the bottom surface faces each other, and the first side surface 125 and the second side surface 126 are connected to two opposite sides of the bottom surface. That is, the first side surface 125 and the second side surface 126 are located between the light emitting surface 121 and the bottom surface.

With reference to FIG. 1B, a cross-sectional profile of each of the positioning protrusions 113 is a trapezoid, and is an isosceles trapezoid. That is, the first positioning side surface 113b and the second positioning side surface 113c of each of the positioning protrusions 113 are symmetrical to each other, and a first angle A1 is sandwiched between the first positioning side surface 113b and the bottom surface 113d and between the second positioning side surface 113c and the bottom surface 113d. In each of the micro light emitting diodes 120, a second angle A2 is sandwiched between the first side surface 125 and the light emitting surface 121 and between the second side surface 126 and the light emitting surface 121. The second angle A2 is less than 90 degrees and is greater than or equal to the first angle A1. Preferably, the second angle A2 may be between 15 degrees and 75 degrees. Besides, if the second angle A2 is greater than the first angle A1, an angle difference value between the second angle A2 and the first angle A1 may be less than or equal to 15 degrees.

In addition, assuming that each micro light emitting diode 120 has a horizontally symmetrical structure, a sum of angles Ac between the first side surface 125 and the second side surface 126 and the bottom surface and the first angle A1 in each micro light emitting diode 120 may be less than 180 degrees. To be specific, in each of the cross-sectional profiles of the micro light emitting diodes 120 and the positioning protrusions 113 shown in FIG. 1B, since the sum of the second angle A2 and the angle Ac is 180 degrees, if the second angle A2 is greater than the first angle A1, the sum of the first angle A1 and the angle Ac should be less than 180 degrees. On the premise that a width of the light emitting surface 121 of each micro light emitting diode 120 is unchanged, the first side surface 125 and the second side surface 126 of the micro light emitting diode 120 are relatively steep slopes, and two ends of the bottom surface of the micro light emitting diode 120 facing of the circuit substrate 110 are closer to the second positioning side surface 113c and the first positioning side surface 113b. In this way, edges of the micro light emitting diodes 120 may contact the positioning protrusions 113, and positioning accuracy is thereby improved.

With reference to FIG. 1B, in this embodiment, the micro light emitting diode display device further includes a plurality of conductive bumps 112 disposed on the circuit substrate 110, and each of the positioning spaces 101 is provided with at least one of the conductive bumps 112. Taking a horizontal micro light emitting diode as an example, two conductive bumps 112 arranged in pairs are arranged in each positioning space 101. Each of the micro light emitting diodes 120 is bonded to the circuit substrate 110 through the two corresponding conductive bumps 112 in the positioning space 101. Further, each positioning protrusion 113 has a top surface 113a. The first positioning side surface 113b and the second positioning side surface 113c are connected to two opposite sides of the top surface 113a, and a height of the top surface 113a of each of the positioning protrusions 113 in a thickness direction of the circuit substrate 110 is greater than the light emitting surface 121 of each of the micro light emitting diodes 120.

That is, the height of the top surface 113a of each of the positioning protrusions 113 away from the circuit substrate 110 is greater than the height of the light emitting surface 121 of each of the micro light emitting diodes 120 away from the circuit substrate 110. Since any two adjacent micro light emitting diodes 120 are separated by one positioning protrusion 113, each positioning protrusion 113 may be used to reduce an influence of light emitted between any two adjacent micro light emitting diodes 120, and contrast and resolution are thereby improved. In other words, a total thickness Ti of each micro light emitting diode 120 and the corresponding conductive bump 112 is less than a thickness T2 of each positioning protrusion 113.

With reference to FIG. 1A and FIG. 1B, in a process of mass transfer, the positions of the micro light emitting diodes 120 may be accurately positioned through the positioning protrusions 113. In this way, each micro light emitting diode 120 is electrically bonded to (e.g., flip-chip bonding) the corresponding two conductive bumps 112 accurately, so a short circuit or an open circuit due to positioning misalignment or errors is prevented, and a transfer yield and accuracy are further improved. To be specific, when the temporary substrate 10 picks up and moves the micro light emitting diodes 120 above the circuit substrate 110, the position of each micro light emitting diode 120 is required to be controlled to fall between any two adjacent positioning protrusions 113. Next, each micro light emitting diode 120 is aligned with the two conductive bumps 112 located between any two adjacent positioning protrusions 113. Finally, the micro light emitting diodes 120 are released, so that each light emitting diode 120 is electrically bonded to the corresponding two conductive bumps 112 accurately.

The auxiliary positioning mechanism provided by the positioning protrusions 113 is conducive to prevent situations such as a short circuit caused by one electrode on each micro light emitting diode 120 overlaps with the two conductive bumps 112 on the circuit substrate 110, or two electrodes on each micro light emitting diode 120 are electrically bonded to one conductive bump 112 on the circuit substrate 110 together, and to prevent invalid electrical bonding (e.g., an open circuit) that the electrodes on each micro light emitting diode 120 deviate from the conductive bumps 112 on the circuit substrate 110.

With reference to FIG. 1B, a cross-sectional width W of each positioning protrusion 113 gradually decreases from the circuit substrate 110 to the top surface 113a, and the positioning spaces 101 configured for accommodating at least one micro light emitting diode 120 are formed between any two adjacent positioning protrusions 113. Therefore, the cross-sectional profile of each positioning space 101 is generally trapezoidal, and the cross-sectional width gradually decreases towards the circuit substrate 110. That is, each positioning space 101 has a larger opening to the outside, so that each micro light emitting diode 120 may be placed in the corresponding positioning space 101. In addition, based on the design of the cross-sectional profile of each positioning space 101, each micro light emitting diode 120 may be guided by any two adjacent positioning protrusions 113 to move to the corresponding two conductive bumps 112, which effectively reduces misalignment or errors.

With reference to FIG. 1B, each micro light emitting diode 120 further includes a first electrode 123 and a second electrode 124. Between any two adjacent positioning protrusions 113, the first electrode 123 and the second electrode 124 of each micro light emitting diode 120 are electrically bonded to two conductive bumps 112. Since the angle design of a corner of each positioning protrusion 113 and the angle design of a corner of each micro light emitting diode 120, each micro light emitting diode 120 may be guided by any two adjacent positioning protrusions 113 to move to the circuit substrate 110, and the first electrode 123 and the second electrode 124 are accurately bonded to the corresponding two conductive bumps 112, so that a short circuit or an open circuit due to positioning misalignment or errors is prevented.

On the other hand, a spacing between any two adjacent positioning protrusions 113 is greater than the width of each micro light emitting diode 120. At a same cross-sectional height, a ratio of the spacing to the width is less than 1.2. By the ratio of the spacing between any two adjacent positioning protrusions 113 to the width of each micro light emitting diode 120 and guiding provided by the two positioning side surfaces (i.e., the second positioning side surface 113c and the first positioning side surface 113b) of any two adjacent positioning protrusions 113, displacement errors between the two electrodes (i.e., the first electrode 123 and the second electrode 124) of each micro light emitting diode 120 and the two conductive bumps 112 may be further reduced.

As shown in FIG. 1B and FIG. 2, the positioning protrusions 113 may be a plurality of positioning ribs and are arranged in parallel. Further, an extension line L of a line connecting the first electrode 123 and the second electrode 124 of each micro light emitting diode 120 passes through the two positioning side surfaces (i.e., the second positioning side surface 113c and the first positioning side surface 113b) of the two positioning protrusions 113. In addition, the light emitting surface 121 of each micro light emitting diode 120 has two opposite sides 121a, and the two positioning protrusions 113 are located on opposite sides of the two sides 121a.

With reference to FIG. 1A and FIG. 1B, in this embodiment, the first electrode 123 and the second electrode 124 of each of the micro light emitting diodes 120 are bonded to the two conductive bumps 112 in the corresponding positioning space 101. A first distance d1 is between the first electrode 123 and the second electrode 124, a second distance d2 is between the two conductive bumps 112. The second distance d2 is greater than the first distance d1, and a ratio of the second distance d2 to the first distance d1 is between 2 and 10, so as to prevent the two conductive bumps 112 from being short-circuited due to solder overlap.

On the other hand, a gap G is between the first side surface 125 of each micro light emitting diode 120 and the second positioning side surface 113c, and a width of the gap G is less than or equal to 5 micrometers. Correspondingly, a width of a gap between the second side surface 126 of each micro light emitting diode 120 and the first positioning side surface 113b may also be less than or equal to 5 micrometers. By reducing the gaps between the side surfaces of the micro light emitting diodes 120 and the positioning side surfaces of the positioning protrusions 113, when the micro light emitting diodes 120 move into the positioning spaces 101, the positioning protrusions 113 may accurately position and guide the micro light emitting diodes 120, so that the first electrode 123 and the second electrode 124 of each micro light emitting diode 120 are bonded to the two conductive bumps 112. That is, even though each conductive bump 112 has a smaller bonding area, the first electrode 123 and the second electrode 124 of each micro light emitting diode 120 may still be positioned and guided by the positioning protrusions 113 to be accurately bonded to the two conductive bumps 112.

Figure 3:
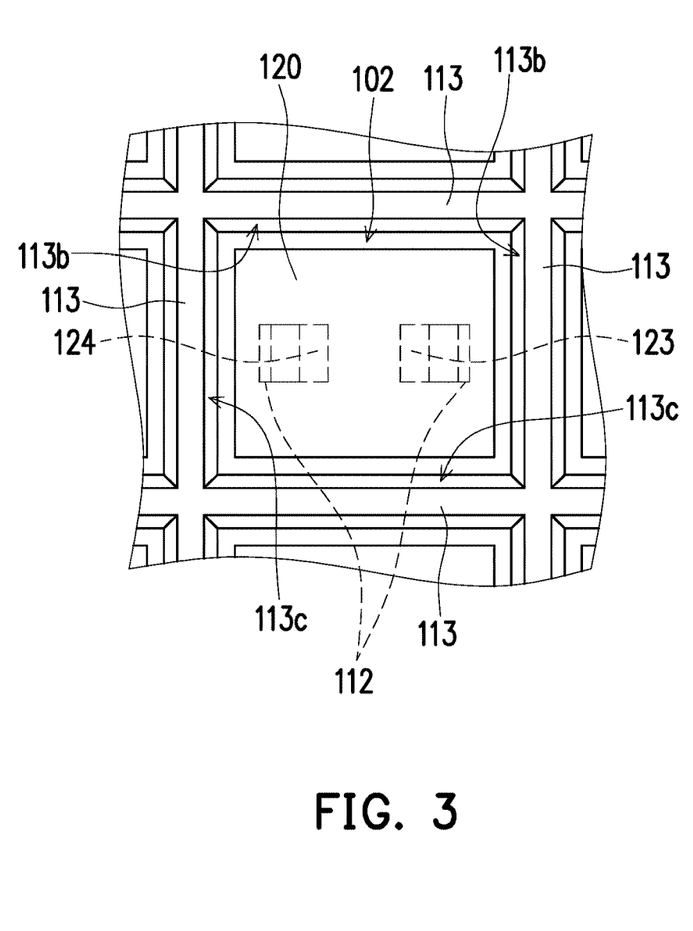
FIG. 3 is a top schematic view of a portion of a micro light emitting diode display device according to another embodiment of the disclosure.

FIG. 3 is a top schematic view of a portion of a micro light emitting diode display device according to another embodiment of the disclosure. With reference to FIG. 3, different from the positioning spaces 101 provided in the previous embodiment, a positioning space 102 provided by this embodiment is surrounded by at least four positioning protrusions 113, and the micro light emitting diode 120 is disposed in the positioning space 102 and is surrounded by four positioning protrusions 113. To be specific, the four positioning protrusions 113 are connected to one another to form a hollow rectangular positioning structure, and the four positioning side surfaces (e.g., two second positioning side surfaces 113c and two first positioning side surfaces 113b) of the four positioning protrusions 113 surround one positioning space 102.

Figure 4:
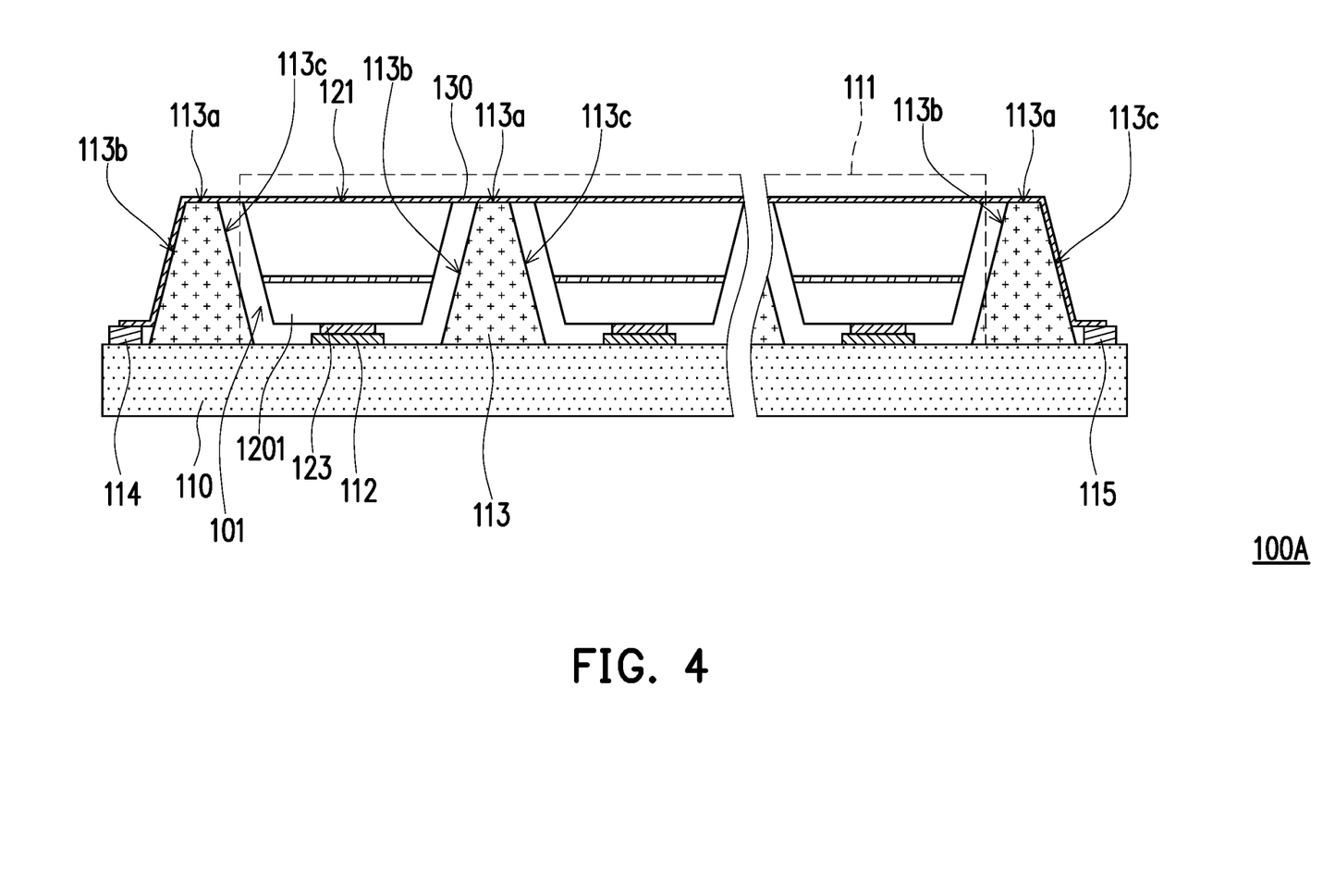
FIG. 4 is a cross-sectional schematic view of a portion of a micro light emitting diode display device according to still another embodiment of the disclosure.

FIG. 4 is a cross-sectional schematic view of a portion of a micro light emitting diode display device according to still another embodiment of the disclosure. With reference to FIG. 4, a micro light emitting diode display device 100A provided by this embodiment and the micro light emitting diode display device 100 shown in FIG. 1B have substantially the same structural design, and a difference therebetween is that: each of a plurality of micro light emitting diodes 1201 of this embodiment is a vertical type micro light emitting diode, and each micro light emitting diode 120 shown in FIG. 1B is a horizontal type micro light emitting diode. To be specific, in each micro light emitting diode 1201, the first electrode 123 is located on the bottom surface. Further, each positioning space 101 is provided with one conductive bump 112, and the first electrode 123 of each micro light emitting diode 1201 is electrically bonded to the corresponding conductive bump 112. That is, each micro light emitting diode 1201 is bonded to the circuit substrate 110 through the corresponding conductive bump 112.

In this embodiment, the height of the top surface 113a of each of the positioning protrusions 113 in the thickness direction of the circuit substrate 110 is equal to the light emitting surface 121 of each of the micro light emitting diodes 120. That is, the height of the top surface 113a of each of the positioning protrusions 113 away from the circuit substrate 110 is equal to the height of the light emitting surface 121 of each of the micro light emitting diodes 120 away from the circuit substrate 110. For instance, a thickness of an epitaxial layer of each of the micro light emitting diodes 120 is between 3 micrometers and 10 micrometers.

As shown in FIG. 4, the micro light emitting diode display device 100A further includes a common electrode layer 130. The common electrode layer 130 covers the top surfaces 113a of the positioning protrusions 113 and the light emitting surfaces 121 of the micro light emitting diodes 1201, and the micro light emitting diodes 1201 are electrically connected to one another through the common electrode layer 130. For instance, the common electrode layer 130 may be a patterned transparent oxide conductive layer and is formed on the light emitting surfaces 121 of the micro light emitting diodes 1201 to act as the second electrodes of the micro light emitting diodes 1201. In a preferred embodiment, the cross-sectional profile of each positioning protrusion 113 is trapezoidal, and the top surface 113a of each positioning protrusion 113 is a flat surface and has the same height as the light emitting surface 121 of each micro light emitting diode 1201. Therefore, the common electrode layer 130 is formed on a flat surface. As such, the patterned common electrode layer 130 has a uniform film thickness, an exposure error caused by the height difference is reduced, and the connection yield of the common electrode layer 130 is thereby improved.

In this embodiment, the circuit substrate 110 defines a display region 111, the micro light emitting diodes 1201 are disposed in the display region 111. On the other hand, the micro light emitting diode display device 100A further includes two common electrode pads 114 and 115 opposite to each other. The two common electrode pads 114 and 115 are disposed outside the display region 111, and the positioning protrusions 113 and the micro light emitting diodes 1201 are arranged in an alternating manner between the common electrode pad 114 and the common electrode pad 115. To be specific, two opposite side extension sections in the common electrode layer 130 extend along the positioning side surfaces (e.g., the first positioning side surface 113b and the second positioning side surface 113c) of two positioning protrusions 113 towards the common electrode pad 114 and the common electrode pad 115 and are connected to the common electrode pad 114 and the common electrode pad 115.

As shown in FIG. 4, a part of the positioning protrusions 113 is arranged in the display region 111, and another part of the positioning protrusions 113 is arranged outside the display region 111.

Figure 5:
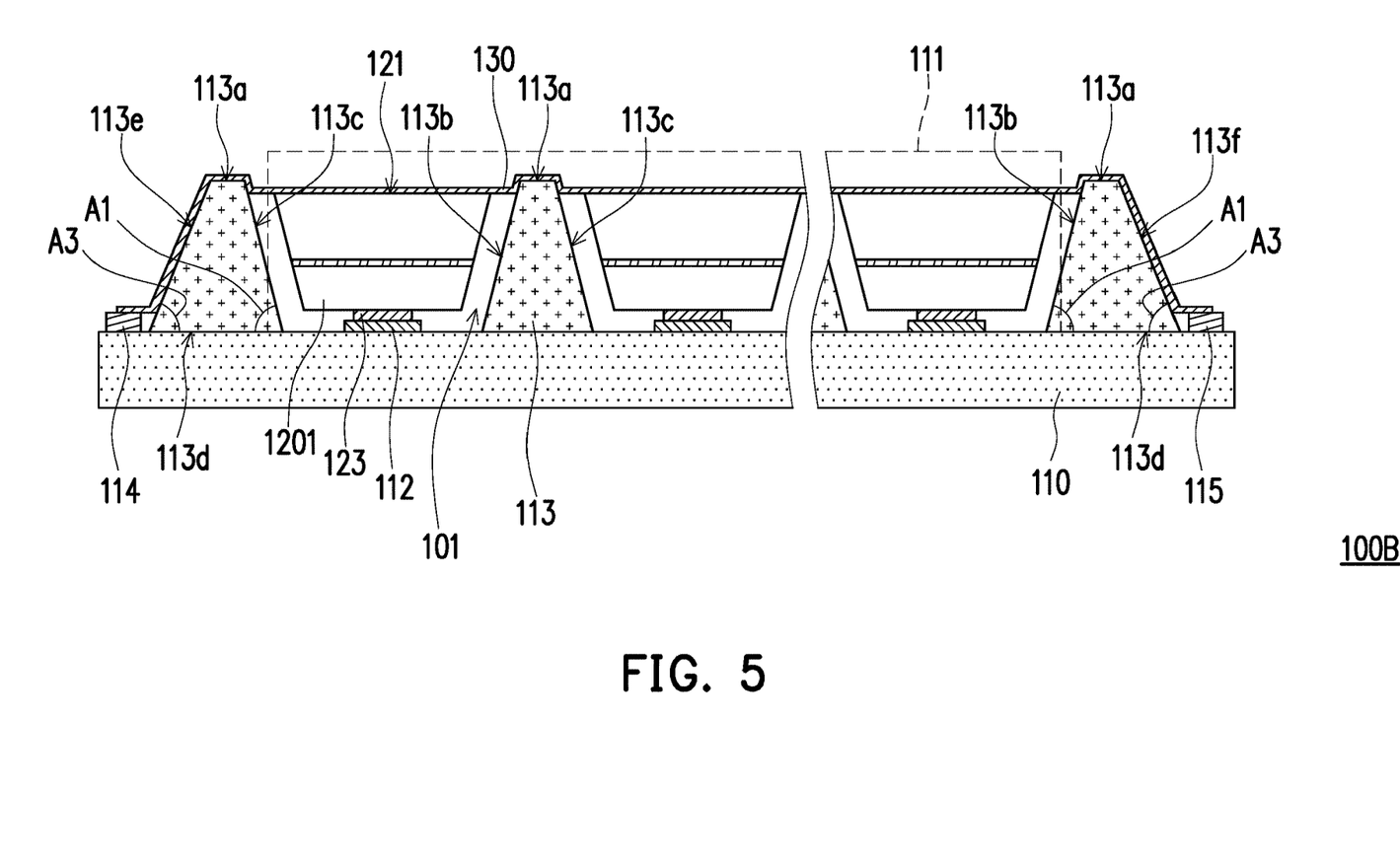
FIG. 5 is a cross-sectional schematic view of a portion of a micro light emitting diode display device according to yet another embodiment of the disclosure.

FIG. 5 is a cross-sectional schematic view of a portion of a micro light emitting diode display device according to yet another embodiment of the disclosure. With reference to FIG. 5, a micro light emitting diode display device 100B provided by this embodiment and the micro light emitting diode display device 100A shown in FIG. 4 have substantially the same structural design, and a main difference therebetween is that: an angle design of the corners of the two positioning protrusions 113 adjacent to the two common electrode pads 114 and 115.

In this embodiment, the positioning protrusion 113 (i.e., a part of the positioning protrusions 113 disposed outside the display region 111) adjacent to the common electrode pad 114 has a connecting side surface 113e opposite to the second positioning side surface 113c, and the positioning protrusion 113 adjacent to the common electrode pad 115 has a connecting side surface 113f opposite to the first positioning side surface 113b. The connecting side surface 113e and the connecting side surface 113f are covered by two opposite side extension sections in the common electrode layer 130, and the two side extension sections are connected to the common electrode pad 114 and the common electrode pad 115.

To be specific, a third angle A3 is sandwiched between the connecting side surface 113e and the corresponding bottom surface 113d and between the connecting side surface 113f and the corresponding bottom surface 113d, and the third angle A3 is less than the first angle A1. That is, at the positions of the connecting side surfaces 113e and 113f, the two side extension sections of the common electrode layer 130 have a relatively gentle slope, and in this way, the common electrode layer 130 is prevented from an open circuit due to being excessively steep during deposition, and good electrical connection is provided between the common electrode layer 130 and the common electrode pad 115. On the other hand, the two positioning protrusions 113 adjacent to the two common electrode pads 114 and 115 are symmetrically arranged, and the cross-sectional profiles are both non-isosceles trapezoids.

As shown in FIG. 5, the height of the top surface 113a of each of the positioning protrusions 113 in the thickness direction of the circuit substrate 110 may also be greater than the light emitting surface 121 of each of the micro light emitting diodes 120. That is, the height of the top surface 113a of each of the positioning protrusions 113 away from the circuit substrate 110 is greater than the height of the light emitting surface 121 of each of the micro light emitting diodes 120 away from the circuit substrate 110, but the disclosure is not limited thereto. For instance, the top surface 113a and the light emitting surface 121 may also be configured with the same height, as shown in FIG. 4. In each of the positioning spaces 101, the common electrode layer 130 extends from the light emitting surface 121 of each micro light emitting diode 120 to the two positioning side surfaces (i.e., the second positioning side surface 113c and the first positioning side surface 113b) of two adjacent positioning protrusions 113, and a portion of the second positioning side surface 113c and a portion of the first positioning side surface 113b are covered by the common electrode layer 130.

Figure 6:
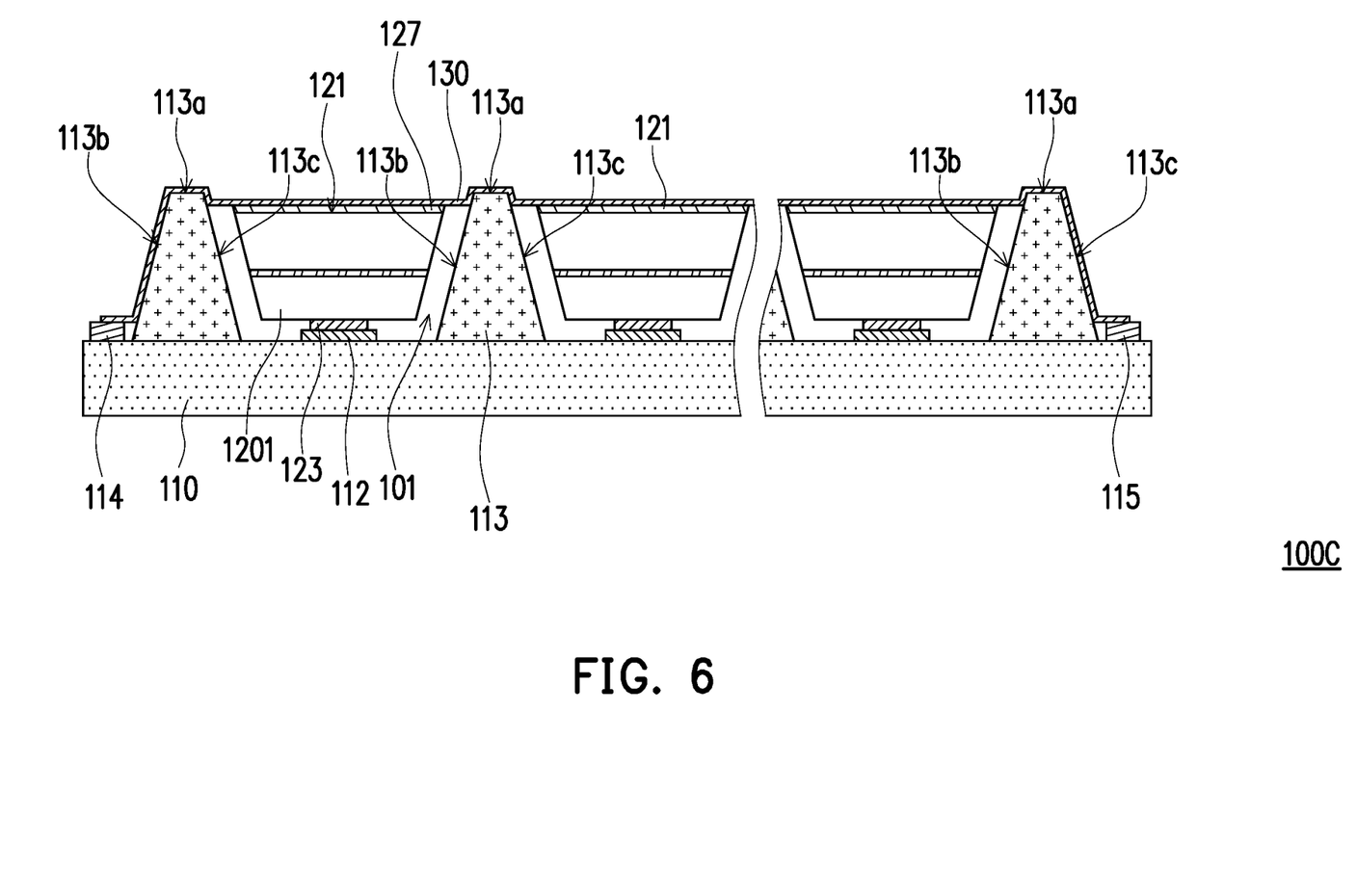
FIG. 6 is a cross-sectional schematic view of a portion of a micro light emitting diode display device according to still another embodiment of the disclosure.

FIG. 6 is a cross-sectional schematic view of a portion of a micro light emitting diode display device according to still another embodiment of the disclosure. With reference to FIG. 6, a micro light emitting diode display device 100C provided by this embodiment and the micro light emitting diode display device 100A shown in FIG. 4 have substantially the same structural design, and a main difference therebetween is that: in this embodiment, a transparent oxide electrode 127 is formed on the light emitting surface 121 of each micro light emitting diode 1201. To be specific, the common electrode layer 130 contacts and covers the transparent oxide electrodes 127 on the light emitting surfaces 121 of the micro light emitting diodes 1201.

On the other hand, the height of the top surface 113a of each of the positioning protrusions 113 in the thickness direction of the circuit substrate 110 is greater than the light emitting surface 121 of each of the micro light emitting diodes 120. That is, the height of the top surface 113a of each of the positioning protrusions 113 away from the circuit substrate 110 is greater than the height of the light emitting surface 121 of each of the micro light emitting diodes 120 away from the circuit substrate 110. In each of the positioning spaces 101, the common electrode layer 130 extends from the light emitting surface 121 of each micro light emitting diode 120 to the two positioning side surfaces (i.e., the second positioning side surface 113c and the first positioning side surface 113b) of two adjacent positioning protrusions 113, and a portion of the second positioning side surface 113c and a portion of the first positioning side surface 113b are covered by the common electrode layer 130.

In view of the foregoing, in the micro light emitting diode display device provided by the disclosure, the plurality of positioning protrusions and the plurality of conductive bumps are arranged on the circuit substrate in an alternating manner, and each of the micro light emitting diodes is disposed between any two adjacent positioning protrusions.

In the process of mass transfer, the positions of the plurality of micro light emitting diodes may be accurately positioned through the plurality of positioning protrusions. In this way, the electrodes of each micro light emitting diode are electrically bonded to the corresponding conductive bumps accurately, so a short circuit or an open circuit due to positioning misalignment or errors is prevented, and the transfer yield and accuracy are further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light emitting diode display device, comprising:
   a circuit substrate;
   a plurality of positioning protrusions, disposed on the circuit substrate, wherein each of the plurality of positioning protrusions has a positioning side surface and a bottom surface, a first angle is included between each of the positioning side surfaces and the corresponding bottom surface, and the plurality of positioning protrusions form a plurality of positioning spaces on the circuit substrate;
   a plurality of micro light emitting diodes, disposed in the separated positioning spaces and electrically connected to the circuit substrate, wherein each of the plurality of micro light emitting diodes has a light emitting surface and a side surface connected to the light emitting surface, each of the plurality of light emitting surfaces is located at a side of the corresponding micro light emitting diode away from the circuit substrate, a second angle is included between each of the side surfaces and the corresponding light emitting surface, and the second angle is less than 90 degrees and is greater than or equal to the first angle; and
   a plurality of conductive bumps, wherein each of the plurality of positioning spaces is provided with at least one of the plurality of conductive bumps, each of the plurality of micro light emitting diodes is bonded onto the circuit substrate through the corresponding conductive bump, each of the plurality of positioning protrusions has a top surface, and a height of the top surface in a thickness direction of the circuit substrate is equal to a height of the light emitting surface of each of the plurality of micro light emitting diodes.

2. The micro light emitting diode display device according to claim 1, wherein a micro light emitting diode of the plurality of micro light emitting diodes is located between the two positioning side surfaces of any two adjacent of the plurality of positioning protrusions, the micro light emitting diode has another side surface connected to the light emitting surface, and the two side surfaces face the two positioning side surfaces, respectively.

3. The micro light emitting diode display device according to claim 2, wherein the micro light emitting diode comprises a first electrode and a second electrode located at a same side, and an extension line of a line connecting the first electrode and the second electrode passes through the two positioning side surfaces of the two positioning protrusions.

4. The micro light emitting diode display device according to claim 2, wherein a gap is maintained between one of the side surfaces of the micro light emitting diode and the corresponding positioning side surface, and a width of the gap is less than or equal to 5 micrometers.

5. The micro light emitting diode display device according to claim 1, wherein the positioning side surfaces of the plurality of positioning protrusions surround any one of the plurality of positioning spaces.

6. The micro light emitting diode display device according to claim 1, wherein each of the plurality of positioning spaces is configured with only one of the plurality of micro light emitting diodes.

7. The micro light emitting diode display device according to claim 1, wherein the second angle is between 15 degrees and 75 degrees.

8. The micro light emitting diode display device according to claim 1, wherein an angle difference value between the second angle and the first angle is less than or equal to 15 degrees.

9. The micro light emitting diode display device according to claim 1, further comprising a common electrode layer, wherein the common electrode layer covers the top surfaces of the plurality of positioning protrusions and is electrically connected to the plurality of micro light emitting diodes.

10. The micro light emitting diode display device according to claim 9, wherein the circuit substrate defines a display region, the plurality of micro light emitting diodes are disposed in the display region, the micro light emitting diode display device further comprises a common electrode pad disposed outside the display region, and the common electrode layer is connected to the common electrode pad.

11. The micro light emitting diode display device according to claim 10, wherein part of the plurality of positioning protrusions are located outside the display region, each of the plurality of positioning protrusions has a connecting side surface opposite to the positioning side surface, the common electrode layer covers the connecting side surfaces and extends to be connected to the common electrode pad, a third angle is included between each of the connecting side surfaces and the corresponding bottom surface, and the third angle is less than the first angle.

12. The micro light emitting diode display device according to claim 1, wherein a cross-sectional width of each of the plurality of positioning protrusions gradually decreases from the circuit substrate to the top surface.

13. The micro light emitting diode display device according to claim 12, wherein a cross-sectional profile of each of the plurality of positioning protrusions is trapezoidal.

14. The micro light emitting diode display device according to claim 1, wherein the plurality of positioning protrusions and the plurality of micro light emitting diodes are arranged on the circuit substrate in an alternating manner.

15. The micro light emitting diode display device according to claim 1, wherein each of the plurality of positioning spaces is provided with two of the plurality of conductive bumps, each of the plurality of micro light emitting diodes comprises a first electrode and a second electrode located at a same side, and the first electrode and the second electrode of each of the plurality of micro light emitting diodes are bonded to the two conductive bumps in the corresponding positioning space,
   a first distance is maintained between the first electrode and the second electrode, a second distance is maintained between the two conductive bumps, and a ratio of the second distance to the first distance is between 2 and 10.

* * * * *